(12) United States Patent
Drevet et al.

(10) Patent No.: US 7,601,618 B2
(45) Date of Patent: Oct. 13, 2009

(54) METHOD FOR PRODUCING SEMI-CONDITIONING MATERIAL WAFERS BY MOULDING AND DIRECTIONAL CRYSTALLIZATION

(75) Inventors: Beatrice Drevet, Grenoble (FR);
Dominique Sarti, Chambery (FR);
Denis Camel, Chambery (FR);
Jean-Paul Garandet, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/213,751

(22) Filed: Jun. 24, 2008

(65) Prior Publication Data

US 2009/0004835 A1    Jan. 1, 2009

(30) Foreign Application Priority Data

Jun. 29, 2007   (FR) .................................. 07 04690

(51) Int. Cl.
*H01L 21/20* (2006.01)
*H01L 21/36* (2006.01)
(52) U.S. Cl. ................. 438/486; 257/E21.133
(58) Field of Classification Search .......... 438/486; 257/E21.133
See application file for complete search history.

(56) References Cited

U.S. PATENT DOCUMENTS

| 6,774,009 B1 * | 8/2004 | Johnson et al. ............. 438/455 |
| 7,547,360 B2 * | 6/2009 | Gupta et al. .................. 117/90 |
| 2007/0169684 A1 * | 7/2007 | Stoddard ..................... 117/13 |

FOREIGN PATENT DOCUMENTS

| EP | 0 115 711 A1 | 8/1984 |
| EP | 1 329 538 A2 | 7/2003 |
| JP | B2-2947529 | 9/1999 |

OTHER PUBLICATIONS

Hide et al."Mould Shaping Silicon Crystal Growth with A Mould Coating Material by the Spinning Method." *Journal of Crystal Growth 79* (1986) pp. 583-589.
Saito et al. "A New Directional Solidification Technique for Polycrystalline Solar Grade Silicon." *IEEE* (1981) pp. 576-580.

* cited by examiner

*Primary Examiner*—Alexander G Ghyka
*Assistant Examiner*—Seahvosh J Nikmanesh
(74) *Attorney, Agent, or Firm*—Oliff & Berridge, PLC

(57) ABSTRACT

Wafers of semi-conducting material are formed by moulding and directional crystallization from a liquid mass of this material. A seed, situated at the bottom of the crucible, presents an orientation along non-dense crystallographic planes. The mould is filled with the molten semi-conducting material by means of a piston or by creation of a pressure difference in the device. The mould is preferably coated with a non-wettable anti-adhesive deposit.

13 Claims, 2 Drawing Sheets

METHOD FOR PRODUCING SEMI-CONDITIONING MATERIAL WAFERS BY MOULDING AND DIRECTIONAL CRYSTALLIZATION

BACKGROUND OF THE INVENTION

The invention relates to a method for producing semi-conducting material wafers by moulding and directional crystallization of a melt of this material by means of a device comprising a crucible and a mould formed by a plurality of intercalary elements spaced apart from one another, the method comprising insertion of a semi-conducting material charge into the crucible, melting thereof and directional solidification thereof in the mould, and separation of the seed and solidified semi-conducting material.

STATE OF THE ART

At present, the majority of photovoltaic cells are made from monocrystalline or polycrystalline silicon. The most widespread crystalline silicon production method implements solidification of ingots from a liquid silicon bath. The ingot is then cut into wafers which can be transformed into photovoltaic cells.

Another approach consists in manufacturing silicon wafer from direct liquid solidification processes (typical thickness comprised between 100 and 500 µm). These processes are mostly processes called pulling processes, i.e. processes in which a liquid silicon film is pulled from a molten bath and then solidified. The silicon ribbon obtained in this way can be either self-supported or pulled on a foreign support.

Patent JP 2947529 describes simultaneous production of a large number of silicon wafers by moulding and solidification. Filling of the volume situated between the different plates of the mould with molten silicon is achieved by means of a piston. The crystallinity of the ingot obtained is not satisfactory. Moreover, the use of a graphite or quartz mould does not enable the wafers to be removed from the mould easily.

Patent EP0115711 describes a method for preparing silicon wafers in a crucible using a mobile mould formed by a plurality of parallel plates. An additional material having a lower melting temperature than that of silicon and presenting a high wettability is used to avoid any contact between the molten silicon and the walls of the crucible and of the mould. When solidification of the silicon takes place, any parasite interaction between the silicon and the walls of the crucible and of the mould is thereby eliminated. A better crystalline structure is thereby obtained. This approach notably has the drawback of requiring use and control of an additional material with a low melting point and high wettability. This does not enable monocrystalline silicon wafers to be produced economically. In addition, the grain orientation and the reproducibility of this orientation are very difficult to control. Indeed, in this case, the grain orientation is only controlled by the thermal gradient, which is not sufficient to obtain a good crystallinity. Furthermore, the silicon wafers have to be cleaned before being used in order to eliminate traces of the additional material on their surfaces.

OBJECT OF THE INVENTION

The object of the invention is to provide a method for manufacturing semi-conducting material wafers not presenting these drawbacks, and more particularly a method that is easy to implement while at the same time ensuring a good crystallographic quality and enabling high solidification rates to be achieved.

The method according to the invention is characterized in that a seed is disposed at the bottom of the crucible before the charge is inserted, and the seed presents a face in contact with the liquid mass, after melting of the charge, the face of the seed having an orientation along non-dense crystallographic planes.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PREFERRED EMBODIMENTS OF THE INVENTION

Figure 1:
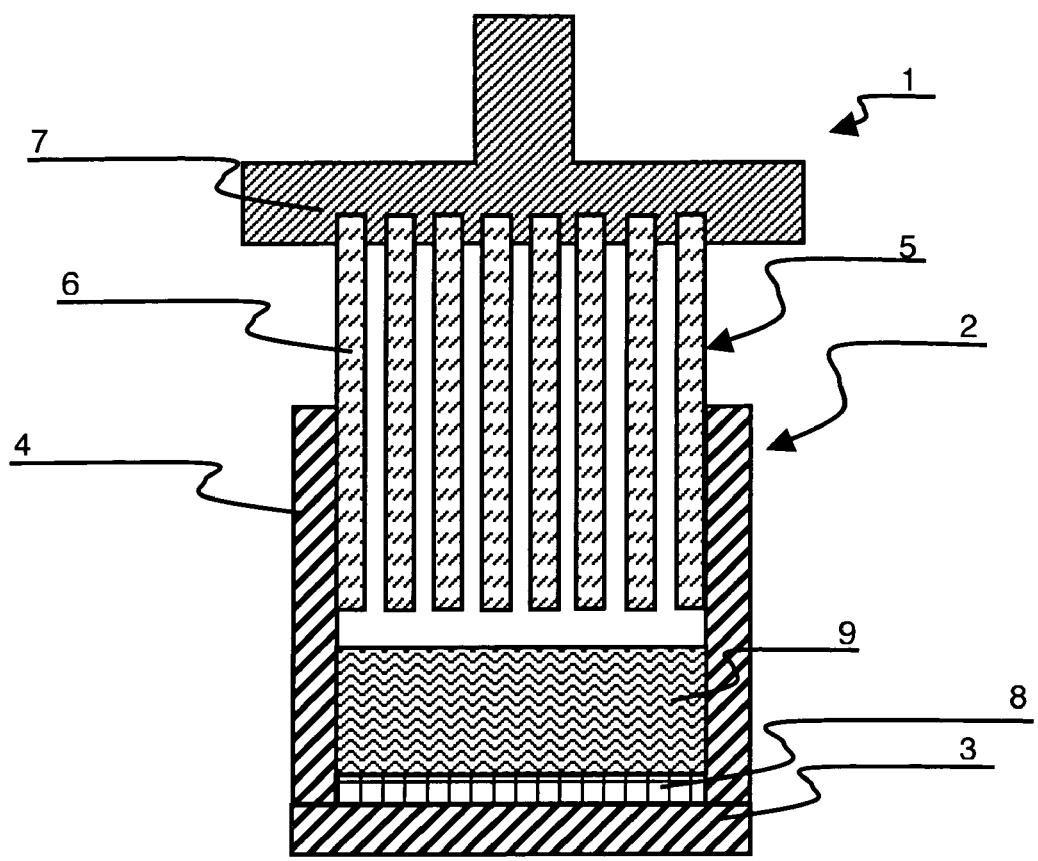
FIGS. 1 and 2 represent, in schematic manner in cross-section, an embodiment of the method according to the invention respectively during a melting phase and during a solidification phase.
Figure 2:
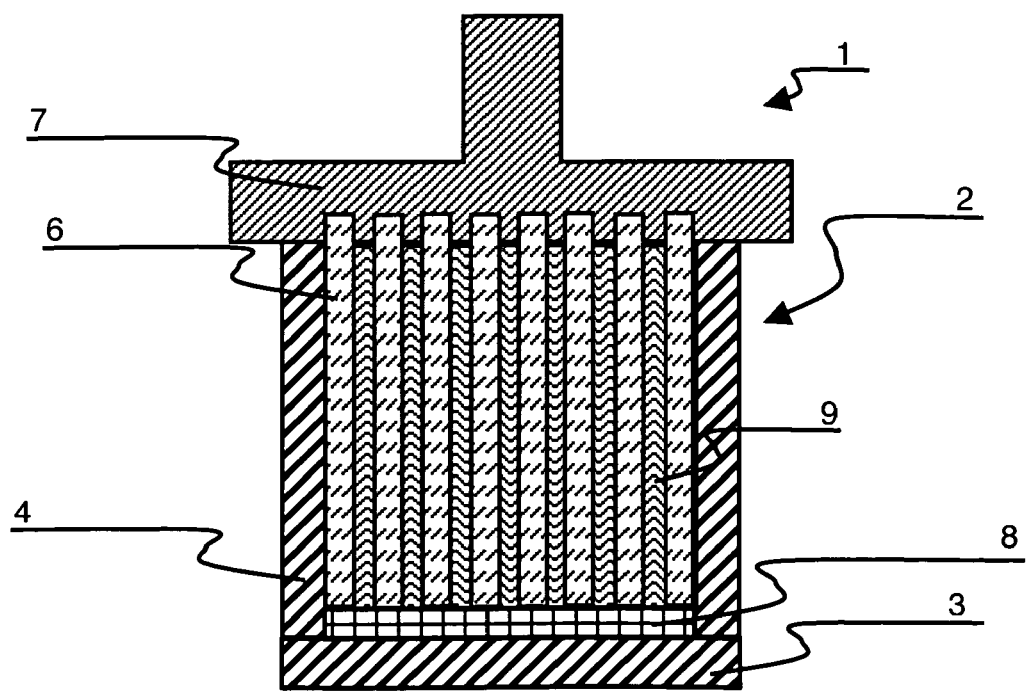

As illustrated in FIGS. 1 and 2, a device 1 for producing semi-conducting material wafers comprises a crucible 2 having a bottom 3 and side walls 4. Device 1 also comprises a mould 5 formed by parallel intercalary elements 6 spaced apart from one another and fixed at their top end to a mobile support 7. Intercalary elements 6 are for example formed by plates that are either flat or have a groove or edges corresponding to the dimensions of the semi-conducting material wafers to be formed.

A seed 8 of semi-conducting material is situated at the bottom of crucible 2. A semi-conducting material feedstock, preferably of microelectronic or photovoltaic quality, is placed in crucible 2 on seed 8. The semi-conducting material feedstock is for example formed by silicon, germanium or an alloy of the latter. Advantageously, seed 8 is formed in the same material as the charge. Seed 8 is in monocrystalline or polycrystalline form, preferably large-grain. The choice of crystallinity of seed 8, monocrystalline or polycrystalline, depends on the required crystallinity of the wafers. The seed advantageously presents a crystalline orientation following non-dense crystallographic planes of the feedstock on its face in contact with the feedstock. This seed may for example be silicon with a <112> plane.

The semi-conducting material feedstock, for example silicon, is then melted by heating means (not shown) able to be achieved by any suitable technique, while taking care not to melt seed 8. Advantageously, the feedstock is heated laterally for example by inductive turns. In this way, a liquid silicon 9 phase is then formed above and in contact with seed 8 and a thermal gradient is created between seed 8 and liquid silicon 9.

Device 1 also conventionally comprises a cooling system comprising heat extraction means (not shown), for example a cooling system by water circulation, advantageously located underneath crucible 2. Device 1 further advantageously comprises means for creating a vacuum in the device enclosure (not shown).

Mould 5, preferably comprising a plurality of intercalary elements 6 fixed onto mobile support 7, is then inserted in crucible 2. Intercalary elements 6 serve the purpose of defining the dimensions of the wafers to be moulded. Intercalary elements 6 of mould 5 conventionally enable simultaneous production of a plurality of silicon wafers. The silicon wafers thus formed have a thickness generally comprised between 100 and 500 µm. The wafers can for example be of rectangular or square shape and typically have a surface area comprised between 50×50 and 250×250 mm$^2$.

The materials of mould 5 are chosen such as not to react chemically with molten silicon 9 to limit the risk of chemical pollution of liquid silicon 9 to the minimum. The materials used to produce mould 5, including intercalary elements 6, are for example graphite or other ceramics such as alumina, silicon nitride or silicon carbide. These materials are advantageously coated on their surface with a deposit that is anti-adhesive to silicon (not shown). This anti-adhesive deposit can for example be a silicon nitride powder-based deposit the method of producing same being in particular described by Hide ("Mould Shaping Silicon Crystal Growth With a Mould Coating Material by the Spinning Method" Journal of Crystal Growth 79 (1986) 583-589) and Saito ("A New Directional Solidification Technique For Polycrystalline Solar Grade Silicon" XV IEEE Photovoltaic Specialists Conference, 1981, p. 576). Advantageously, crucible 2 can be coated with the same anti-adhesive deposit. This type of coating presents the interest of enabling mould 5 to be reused for subsequent fabrication of other silicon wafers.

Moreover, intercalary elements 6 of mould 5 are advantageously made from a more thermally conducting material than silicon, for example graphite.

In conventional manner, the mould can be filled with molten silicon 9 by means of a piston. As an example, represented in FIG. 2, the piston is formed by mould support 7. In this way, as intercalary elements 6 progressively descend into crucible 2, mould 5 is filled with molten silicon 9. Filling of mould 5 is terminated when the latter is completely immersed in liquid silicon 9. Prior to its insertion in liquid silicon 9, mould 5 is preferably heated to a temperature higher than the melting temperature of silicon.

Figure 3:
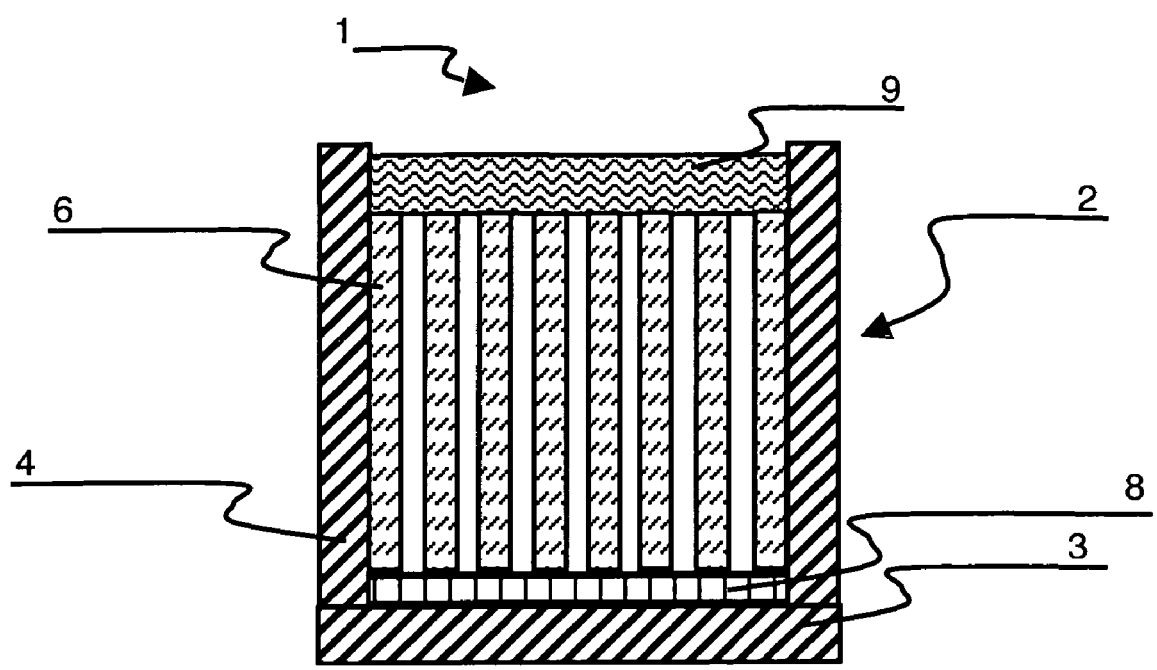
FIG. 3 represents an alternative embodiment of the method according to the invention, in schematic manner in cross-section.

In an alternative embodiment illustrated in FIG. 3, mould 5 is first brought into direct contact with seed 8 in crucible 2 and the semi-conducting material feedstock is initially disposed above intercalary elements 6 of mould 5. Filling of mould 5 with molten silicon 9 is then obtained by creating a pressure difference within device 1, for example by applying a gas overpressure on the free surface of the bath of molten silicon 9 or by suction from the bottom of intercalary elements 6.

Throughout this filling phase of mould 5, the thermal gradient existing between the silicon in liquid phase 9 and seed 8 is controlled so as to keep seed 8 in solid phase.

When molten silicon 9 fills mould 5, the silicon is solidified in directed manner at low speed, typically in the range comprised between 0.01 and 1 cm/min, so as to obtain a good crystalline quality. Directional solidification can be performed by moving the controlled heating and/or cooling system. The cooling system enables the heat flux to be removed in unidirectional manner in the plane of the silicon wafers, perpendicularly to the surface of seed 8. The use of unidirectional heat extraction enables the thermomechanical stresses to be minimized and a macroscopically flat solidification front to be obtained leading to a columnar grain structure if seed 8 is polycrystalline.

Intercalary elements 6 being formed in a more thermally conducting material than silicon, the heat of the wafers is extracted laterally and transmitted to bottom 3 of crucible 2 by means of intercalary elements 6. If the silicon charge contains very few impurities, the solidification rate remains lower than the critical morphological destabilization rate of the solid/liquid front. Under these conditions, the maximum solidification rate is only limited by the heat flux extraction capacity of device 1. The use of a mould presenting intercalary elements 6 that are more thermally conducting than silicon increases the heat flux extraction capacity compared with crystallization as an ingot. Thus, with the same crystalline quality of the silicon, the use of a seed 8 associated with a mould 6 enables a faster solidification rate to be used than by a crystallization method of an ingot from a seed.

The use of a seed 8 presenting an orientation along non-dense crystallographic planes on its top surface leads to a lower growth supercooling of the silicon in comparison with a seed 8 oriented along dense planes. A seed 8 oriented along non-dense crystallographic planes thereby enables faster solidification rates to be used, while at the same time limiting supercooling of the liquid to a lower value than that resulting from heterogeneous germination before the solidification front and therefore an equiaxial growth.

During crystallization of the silicon between intercalary elements 6, the reduced size of the space between intercalary elements 6 forming the moulding element does not enable a good agitation of the liquid silicon 9. Segregation of the species, in particular of the dopant species, is limited. This results in the distribution for example of the dopants, for example of phosphorus, being more homogeneous along the (vertical) solidification direction than with most other techniques in particular during crystallization of an ingot. This device is therefore well suited for producing advantageously n-doped silicon wafers.

After solidification, the silicon wafers are securely joined to seed 8. They are then separated from seed 8, for example by laser cutting. Seed 8 can thus be reused for formation of new silicon wafers. After they have been released from seed 8, the wafers are directly usable, after a part of the anti-adhesive coating stuck to their surface has been removed if necessary.

The invention claimed is:

1. A method for producing semi-conducting material wafers by moulding and directional crystallization of a liquid mass of this material by means of a device comprising a crucible and a mould formed by a plurality of intercalary elements spaced apart from one another, method comprising
   disposing a seed at the bottom of the crucible,
   inserting a semi-conducting material feedstock into the crucible,
   melting the feedstock, the seed presenting a face having an orientation along non-dense crystallographic planes in contact with the melt,
   directional solidifying the feedstock in the mould, and
   separating the seed and the solidified semi-conducting material.

2. The method according to claim 1, wherein the mould is coated with a non-wettable anti-adhesive deposit.

3. The method according to claim 1, wherein the mould comprises a mobile support to which the intercalary elements are fixed and which constitutes a piston for filling the mould with molten semi-conducting material.

4. The method according to claim 1, wherein the molten semi-conducting material being initially arranged above the mould, the device comprises means for creating a pressure difference within the device to fill the mould with molten semi-conducting material.

5. The method according to claim 1, wherein the intercalary elements present a higher thermal conductivity than that of the semi-conducting material.

6. The method according to claim 1, wherein the intercalary elements are made of graphite.

7. The method according to claim 1, wherein the seed is of monocrystalline type.

8. The method according to claim 1, wherein the seed is of polycrystalline type.

9. The method according to claim 1, wherein the semi-conducting material is made from silicon and/or germanium.

10. The method according to claim 9, wherein a solidification rate is comprised within the 0.01-1 cm/min range.

11. The method according to claim 9, wherein the semi-conducting material feedstock being initially arranged directly above the seed, the mould is filled with the molten semi-conducting material by downward movement of the mould.

12. The method according to claim 9, wherein the semi-conducting material feedstock being initially arranged above the intercalary elements of the mould, the mould is filled with the molten semi-conducting material by creation of a pressure difference.

13. The method according to claim 1, wherein the semi-conducting material is made from silicon for photovoltaic applications.

* * * * *